(12) United States Patent
Liaw

(10) Patent No.: US 6,380,024 B1
(45) Date of Patent: Apr. 30, 2002

(54) METHOD OF FABRICATING AN SRAM CELL FEATURING DUAL SILICIDE GATES AND FOUR BURIED CONTACT REGIONS

(75) Inventor: Jhon Jhy Liaw, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/498,980

(22) Filed: Feb. 7, 2000

(51) Int. Cl.[7] .................. H01L 21/8234; H01L 21/8244
(52) U.S. Cl. ......................... 438/238; 438/586
(58) Field of Search .................. 257/296, 297, 257/379, 381, 382, 383, 385, 301; 438/586, 514, 526, 533, 685, 197, 238, 241

(56) References Cited

U.S. PATENT DOCUMENTS

| | | | |
|---|---|---|---|
| 4,804,636 A | * 2/1989 | Groover, III et al. | 437/52 |
| 5,010,032 A | 4/1991 | Tang et al. | 437/57 |
| 5,451,534 A | 9/1995 | Yang | 437/52 |
| 5,521,860 A | * 5/1996 | Ohkubo | 365/154 |
| 5,573,980 A | 11/1996 | Yoo | 437/200 |
| 5,719,079 A | 2/1998 | Yoo et al. | 438/238 |
| 5,866,451 A | 2/1999 | Yoo et al. | 438/241 |
| 6,080,647 A | * 6/2000 | Huang et al. | 438/586 |

\* cited by examiner

Primary Examiner—Matthew Smith
Assistant Examiner—Calvin Lee
(74) Attorney, Agent, or Firm—George O. Saile; Stephen B. Ackerman

(57) ABSTRACT

A process of fabricating an SRAM cell, comprised with four NMOS devices, and two PMOS devices, featuring a dual gate polycide structure, traversing both NMOS and PMOS device regions, and featuring buried contact regions used for connection of specific NMOS drain regions, and used for connection of specific PMOS regions, has been developed. The process features the simultaneous fabrication of polysilicon gate structures, on an underlying gate insulator layer, and polysilicon buried contact structures, formed directly on the semiconductor substrate. The creation of heavily doped regions, in area between the polysilicon gate structures, and the polysilicon buried contact structures, also result in the doping of both structures. Subsequent anneal procedures result in the formation of a buried contact region, underlying the polysilicon buried contact structure. The contact between the buried contact regions, and the adjacent heavily doped source/drain regions, result in the desired connection of several device drain regions.

28 Claims, 6 Drawing Sheets

METHOD OF FABRICATING AN SRAM CELL FEATURING DUAL SILICIDE GATES AND FOUR BURIED CONTACT REGIONS

The invention relates to methods used to fabricate semiconductor devices and integrated circuits, and more specifically to a layout and a method of fabrication of a static random access memory (SRAM) cell.

DESCRIPTION OF THE PRIOR ART

Static random access memory (SRAM) cells, comprised with four N channel metal oxide semiconductor (NMOS) devices and two P channel metal oxide semiconductor (PMOS) devices dissipate less power than counterpart SRAM cells, comprised with either six NMOS devices, or comprised with poly load resistors, when in the stand-by mode of operation. However this type of SRAM cell (four NMOS, two PMOS) results in a significant increase in cell size when compared to counterpart SRAM cells. This invention will describe an SRAM layout comprised with the four NMOS and two PMOS devices, featuring the use of buried contact regions used to connect drain regions of specific devices, thus reducing the area of the SRAM cell when compared to counterpart SRAM cells fabricated using a more area consuming metal contact and interconnect approach. This invention will thereby describe a novel process sequence for fabricating the buried contact regions for both the NMOS and PMOS devices of the SRAM cell, as well as describing the process used to create a dual polycide gate structure, again used to conserve cell area. Prior art such as Yoo et al, in U.S. Pat. No. 5,866,451, as well as Yoo et al, in U.S. Pat. No. 5,719,079, describe methods of fabricating SRAM cells featuring silicide or polycide gate structures. However these prior arts do not describe the novel buried contact regions and dual silicide gate structures featured in this present invention.

SUMMARY OF THE INVENTION

It is an object of this invention to fabricate a SRAM cell comprised with four NMOS devices and two PMOS devices.

It is another object of this invention to use buried contact regions to connect drain regions for specific NMOS devices, and to connect the drain regions of specific PMOS devices.

It is still another object of this invention to use a dual polycide gate structure for the NMOS and PMOS devices of the SRAM cell.

In accordance with the present invention the layout and fabrication of an SRAM cell, featuring the use of buried contact regions used to connect drain regions of specific NMOS and PMOS devices of the SRAM cell, and featuring the use of a dual polycide gate structure, is described. After forming a gate insulator layer and an overlying split polysilicon layer, a patterning procedure is employed to remove regions of the split polysilicon layer and the gate insulator layer, exposing areas of a semiconductor substrate to be used for subsequent buried contact regions in both a first region of the semiconductor substrate to be used for the SRAM NMOS devices, and in a second region of the semiconductor substrate to be used for SRAM PMOS devices. A second polysilicon is deposited followed by a patterning procedure forming polysilicon gate structures on the underlying gate insulator layer in both the NMOS and PMOS regions, and forming polysilicon buried contact structures in both the NMOS and PMOS regions, on areas of the semiconductor substrate to be subsequently used for the buried contact regions. Lightly doped source/drain regions, for both NMOS and PMOS devices, are formed in regions of the semiconductor substrate not covered by the polysilicon gate structures or by the polysilicon buried contact structures. After formation of insulator spacers on the sides of all polysilicon gate structures and on the sides of all polysilicon buried contact structures, heavily doped source/drain regions are formed for both NMOS and PMOS device. The dopants used for the heavily doped source/drain regions are also implanted into the polysilicon buried contact structures. A metal silicide layer is next formed on the top surface of all polysilicon gate structures, on the top surface of all polysilicon buried contact structures, and on the top surface of all NMOS and PMOS heavily doped source/drain regions. A post-heavily doped source/drain anneal, in addition to the anneal cycles used for metal silicide formation, result in the formation of the buried contact regions underlying the polysilicon buried contact structure in both the NMOS and PMOS regions. The contact between the buried contact regions underlying the polysilicon buried contact structure, and the adjacent heavily doped source/drain region, allow connection of drain regions of specific NMOS and PMOS devices to occur. Contact holes in an inter-level dielectric layer is followed by formation of metal plug structures, contacting polysilicon buried contact structures, contacting a dual gate polysilicon structure, as well as contacting source/drain regions for both NMOS and PMOS devices. This is followed by a metallization shape resulting in a SRAM cell configuration with four NMOS devices and two PMOS devices, featuring a reduction in the area used for the SRAM cell as a result of the use of buried contact regions used to connect device drain regions.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
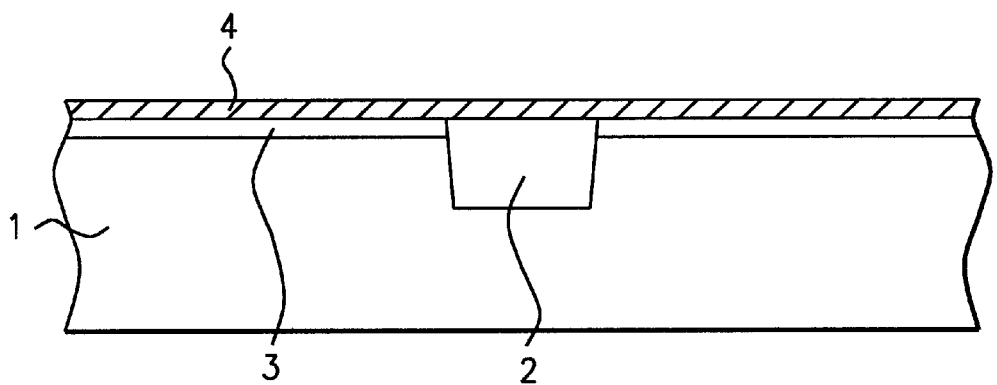
FIGS. 1–3, 4B, 5–8, 9B, and 9C, which schematically in cross-sectional style describe key stages of fabrication for the SRAM cell, featuring buried contact regions FIGS. 4A and 9A, which schematically shows a top view of the SRAM cell at key stages of fabrication.

The method of fabricating an SRAM cell comprised with four NMOS devices and two PMOS devices, featuring buried contact regions used to connect drain regions of the NMOS devices, and to connect the drain regions of the PMOS devices, as well featuring the use of a dual polycide gate structure, will now be described in detail. A P type semiconductor substrate 1, comprised of single crystalline silicon, with a <100> crystallographic orientation is used and schematically shown in FIG. 1. An isolation region 2, either a field oxide region (FOX) or a shallow trench isolation (STI) region, is next formed in semiconductor substrate 1. The FOX option is formed via use of a thermal oxidation procedure applied to regions of the semiconductor substrate not covered by an oxidation resistant masking pattern, such as silicon nitride. After thermally growing the FOX region to a thickness between about 2000 to 7000 Angstroms, the oxidation resistant masking pattern is removed. The STI option is obtained via initially forming a shallow trench shape in the semiconductor substrate via an anisotropic, reactive ion etching (RIE) procedure. After filling the shallow trench shape with a silicon oxide layer, via low pressure chemical vapor deposition (LPCVD) or plasma enhanced chemical vapor deposition (PECVD) procedures, a chemical mechanical polishing (CMP) procedure, is used to remove unwanted regions of the silicon oxide layer resulting in a silicon oxide filled STI region. Isolation regions 2, schematically shown in FIG. 1, are used to physically and electrically isolate specific NMOS devices as well as specific PMOS devices.

At this stage of the process a P well region to be used for the subsequent NMOS devices, and an N well region to be used for the PMOS devices, are formed in regions of semiconductor substrate 1. In addition threshold adjust regions, and anti-punch through regions are also formed in the P well, and N well regions. These regions, P well, N well, threshold adjust, and anti-punch through, are not shown in the drawings. A gate insulator layer 3, comprised of silicon dioxide, is next thermally grown to a thickness between about 40 to 150 Angstroms on regions of semiconductor substrate 1, not occupied by isolation regions 2. An undoped first polysilicon layer, or a split polysilicon layer 4, is deposited via LPCVD procedures at a thickness between 250 to 750 Angstroms. The results of these procedures is schematically shown in FIG. 1.

Figure 2:
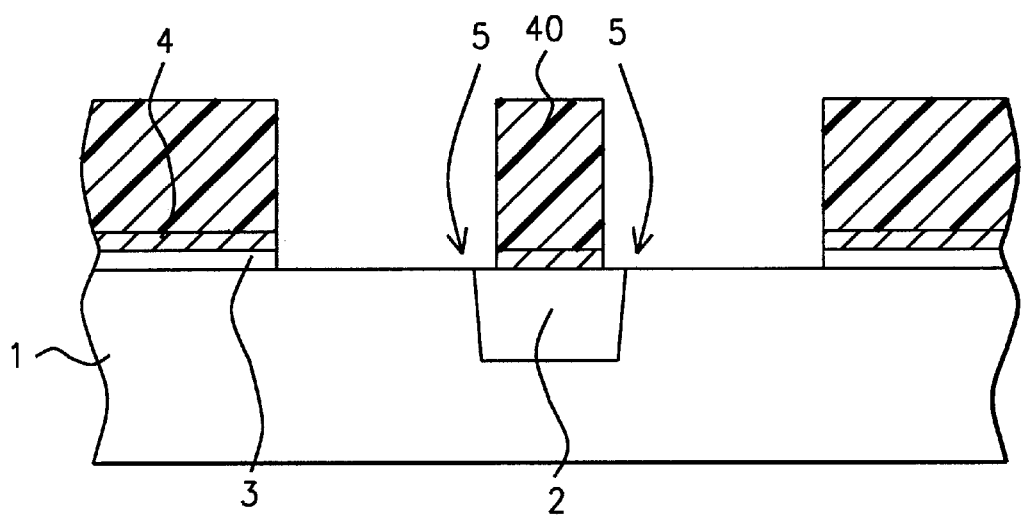
Figure 3:
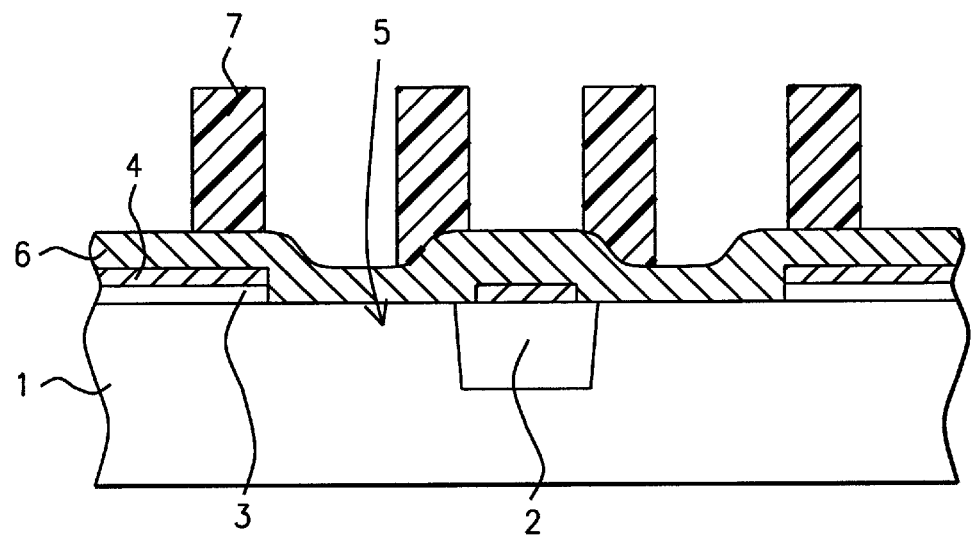

Photoresist shape 40, is then used as a mask to allow exposed regions of split polysilicon layer 4, and underlying exposed regions of gate insulator layer 3, to be removed exposing portion 5, of semiconductor substrate 1, to be used for the buried contact region. Split polysilicon layer 4, is removed via a RIE procedure using $Cl_2$ or $SF_6$ as an etchant, while exposed regions of gate insulator 3, are removed via a selective RIE procedure using $CHF_3$ as an etchant, or via use of a buffered hydrofluoric acid procedure. This is schematically shown in FIG. 2. Removal of photoresist shape 40, is accomplished using plasma oxygen ashing and careful wet cleans. An undoped second polysilicon layer 6, is next deposited via LPCVD procedures to a thickness between about 500 to 1500 Angstroms, overlying split polysilicon layer 4, and overlying portion 5, of semiconductor substrate 1. Photoresist shape 7, is next formed on second polysilicon layer 6, to be used as an etch mask to define subsequent gate structures and buried contact structures. This is schematically shown in FIG. 3.

Figure 4A:
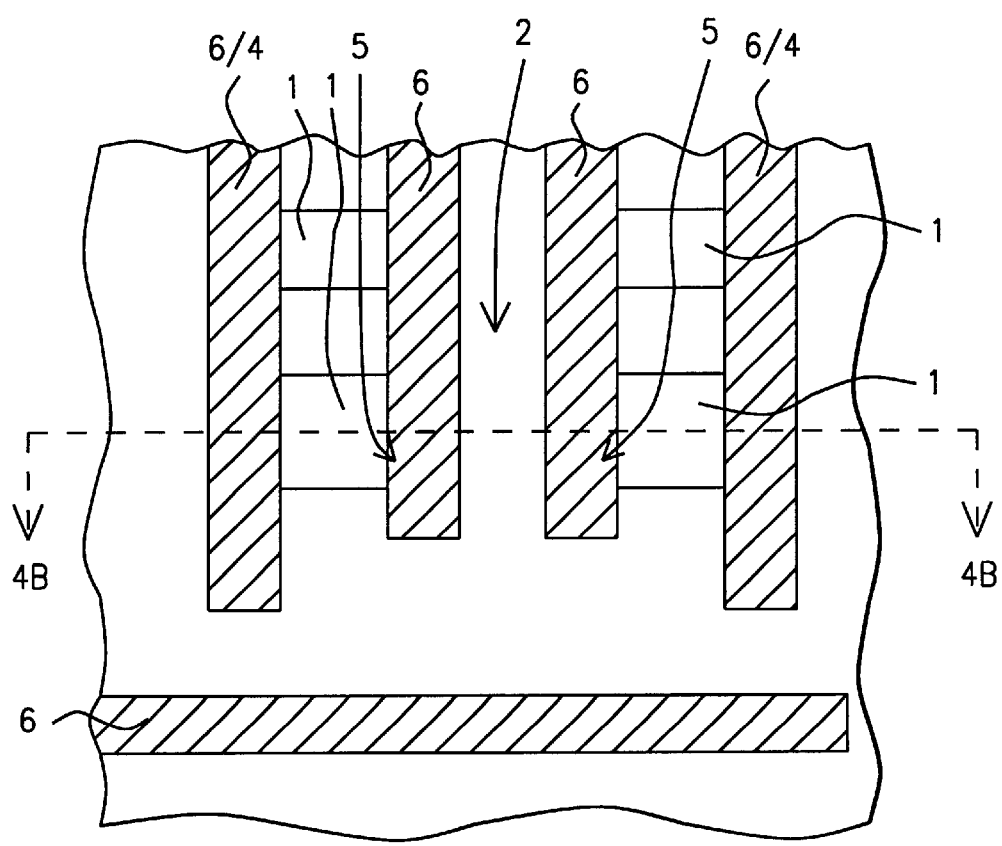
Figure 4B:
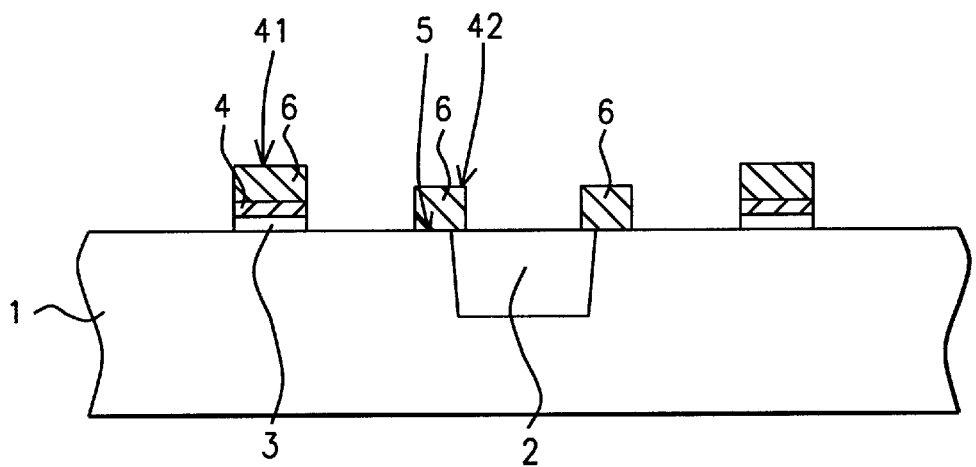

An anisotropic RIE procedure, using $Cl_2$ or $SF_6$ as an etchant, is used to etch second polysilicon layer 6, creating buried contact structures 42, while the same RIE procedure results in the etching of second polysilicon layer 6, and of split polysilicon layer 4, resulting in the creation of polysilicon gate structures 41, an gate insulator layer 3. The anisotropic RIE procedure selectively terminates at the appearance of gate insulator 3. Defining photoresist shape 7, is removed via plasma oxygen ashing and careful wet clean procedures. The wet clean procedures include a buffered hydrofluoric acid step, removing the regions of gate insulator layer 2, not covered by polysilicon gate structures 41. The result of these procedures is schematically shown in cross-sectional style, in FIG. 4B, while a top view of the SRAM cell, at this stage of fabrication, is shown schematically in FIG. 4A.

Figure 5:
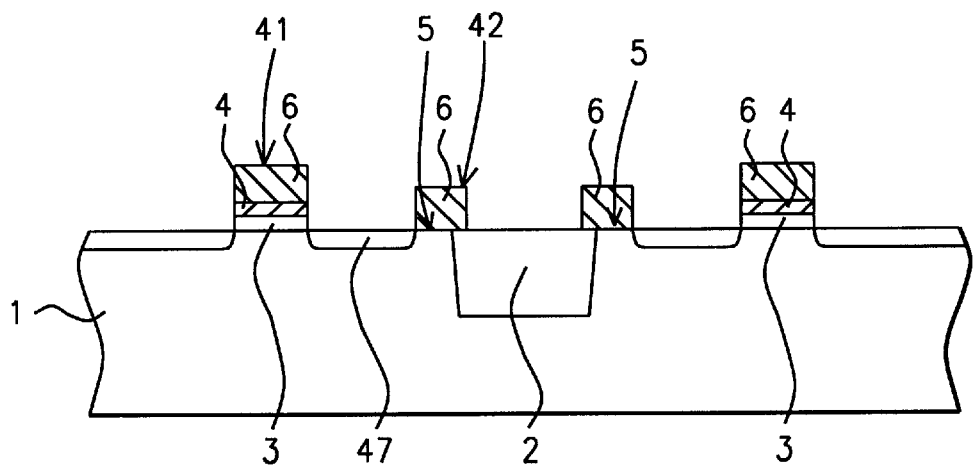

At this stage of SRAM cell fabrication source/drain and buried contact region formation for NMOS devices, as well as for PMOS devices, is addressed. A photoresist shape not shown in the drawings, is used to block out, or protect subsequent PMOS regions from an ion implantation procedure used to form N type lightly doped source/drain regions 47, in the NMOS region of semiconductor substrate 1, not covered by polysilicon gate structures 41, or by buried contact structures 42. N type lightly doped source/drain regions 47, are formed via ion implantation of arsenic, or phosphorous ions, at an energy between about 5 to 60 KeV, at a dose between about 1E13 to 3E14 atoms/$cm^2$. This is schematically shown in FIG. 5. After removal of the photoresist shape used to block out PMOS regions from the N type lightly doped source/drain ion implantation procedure, a photoresist shape, not shown in the drawings, is used to protect NMOS regions from an ion implantation procedure used to create P type lightly doped source/drain regions in an area of the PMOS region of semiconductor substrate 1, not covered by polysilicon gate structures 41, or by buried contact structures 42. The P type lightly doped source/drain regions, not shown in the drawings, are formed via ion implantation of boron, or $BF_2$ ions, at an energy between about 2 to 60 KeV, at a dose between about 1E13 to 3E14 atoms/$cm^2$. The photoresist shape used to block out the NMOS region, is removed via plasma oxygen ashing and careful wet cleans.

Figure 6:
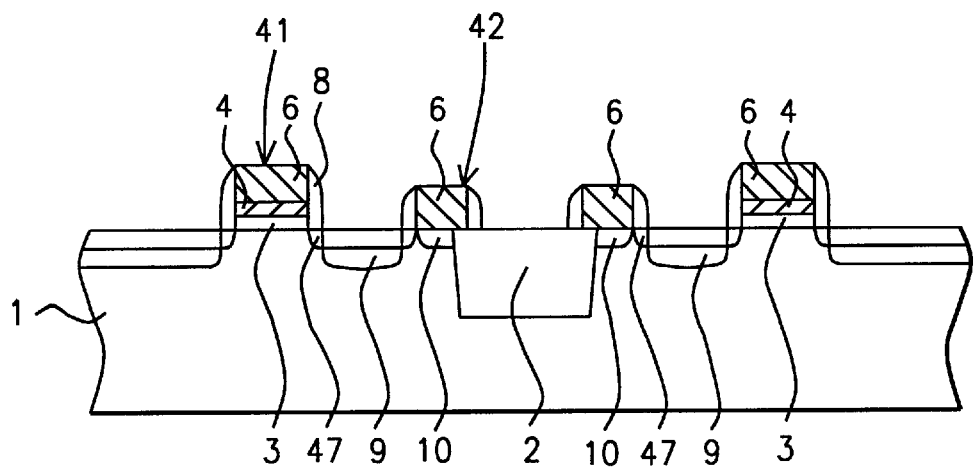

An insulator layer such as silicon oxide, or silicon nitride, is next deposited via LPCVD or PECVD procedures to a thickness between about 600 to 2500 Angstroms. An anisotropic RIE procedure, using $CHF_3$ as an etchant, is used to create insulator spacers 8, on the sides of polysilicon gate structures 41, and on the sides of buried contact structures 42. This is schematically shown in FIG. 6. Another photoresist block out shape is then used to protect PMOS regions from an ion implantation procedure used to form N type heavily doped source/drain regions 9, in areas of the NMOS region in semiconductor substrate 1, not covered; by polysilicon gate structures 41, not covered by buried contact structures 42, or not covered by insulator spacers 8. This ion implantation procedure, performed using arsenic ions, at an energy between about 10 to 60 KeV, at a dose between about 2E15 to 6E15 atoms/$cm^2$, also results in the doping polysilicon gate structures 41, as well as the doping of buried contact structures 42, which will after subsequent anneal cycles result in the formation of the desired buried contact region underlying buried contact structures 42. After removal the photoresist shape used to block out the PMOS regions, another photoresist shape is used to protect the NMOS regions from an ion implantation procedure used to create P type heavily doped source/drain regions. This is not shown in the drawings. The P type source/drain regions are formed via ion implantation of boron or $BF_2$ ions, at an energy between about 2 to 60 KeV, at a dose between about 2E15 to 6E15 atoms/$cm^2$. This P type, ion implantation procedure also results in the P type doping of exposed polysilicon gate structures 41, and of exposed buried contact structures 42. Subsequent anneal cycles will allow out diffusion of P type dopants from the buried contact structure resulting in the desired P type buried contact regions underlying the P type doped buried contact structures. Removal of the photoresist shape, used to protect NMOS regions from the P type ion implantation procedures, is performed via plasma oxygen ashing and careful wet cleans. The anneal cycle used to create the N type and P type buried contact regions, is now performed via conventional furnace procedures at a temperature between about 750 to 850° C., for a time between about 10 to 120 min, or via use of rapid thermal anneal procedures, at a temperature between about 850 to 1050° C., for a time between about 10 to 120 sec.

Figure 7:
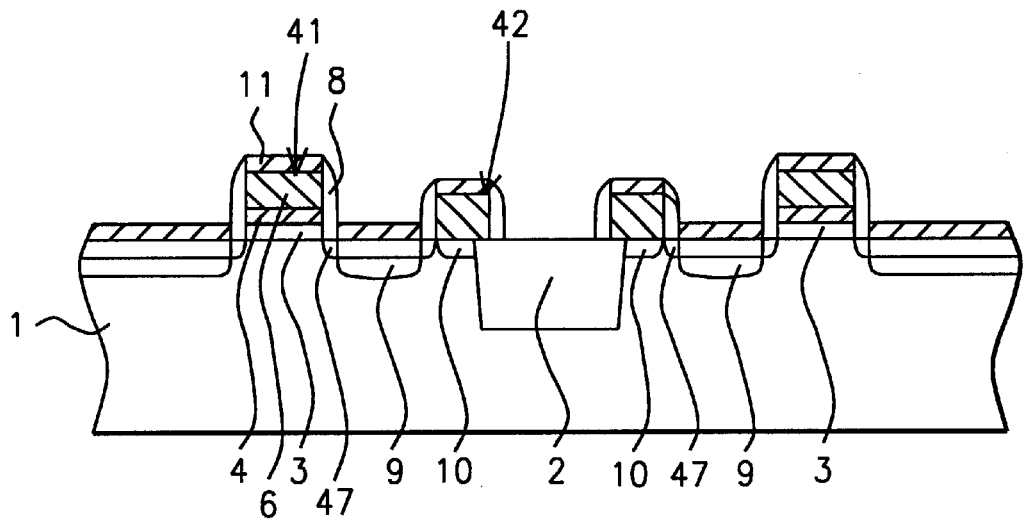

The formation of a metal silicide layer, and the creation of buried contact regions, is next addressed and shown schematically in FIG. 7. A layer of titanium, or cobalt, is deposited using plasma vapor deposition procedures at a thickness between about 50 to 400 Angstroms. A first rapid thermal anneal (RTA) procedure is performed at a temperature between about 500 to 700° C., in an nitrogen ambient for a time between about 10 to 120 sec, forming a titanium silicide layer 11, or a cobalt silicide layer, on the top surface of all polysilicon gate structures 41, and on the top surface of all buried contact structures 42, as well as on the top surface of both N type heavily doped source/drain regions 9, and on the top surface of P type heavily doped source/drain regions, (not shown in FIG. 7). Regions of titanium, or cobalt, residing on insulator spacers 8, or on isolation region 2, remain unreacted. A wet etch procedure, using a solution comprised of $H_2O_2$—HCl—$NH_4OH$—$H_2SO_4$, at a temperature between about 25 to 80° C., is employed to selectively remove the regions of unreacted titanium, or cobalt, followed by a second RTA procedure, performed at a temperature between about 750 to 900° C., for a time between about 10 to 120 sec, in a nitrogen ambient. The second RTA procedure results in a reduction in the resistance of the titanium silicide layer 11, and most importantly allows out diffusing of dopants from buried contact structures 42, creating buried contact regions 10, underlying the buried contact structures. This is schematically shown, for the NMOS region, in FIG. 7, featuring N type buried contact regions 10. Although not shown in this drawing, the RTA procedures also allow P type buried contact regions to be formed underlying buried contact structures in the PMOS region.

Figure 8:
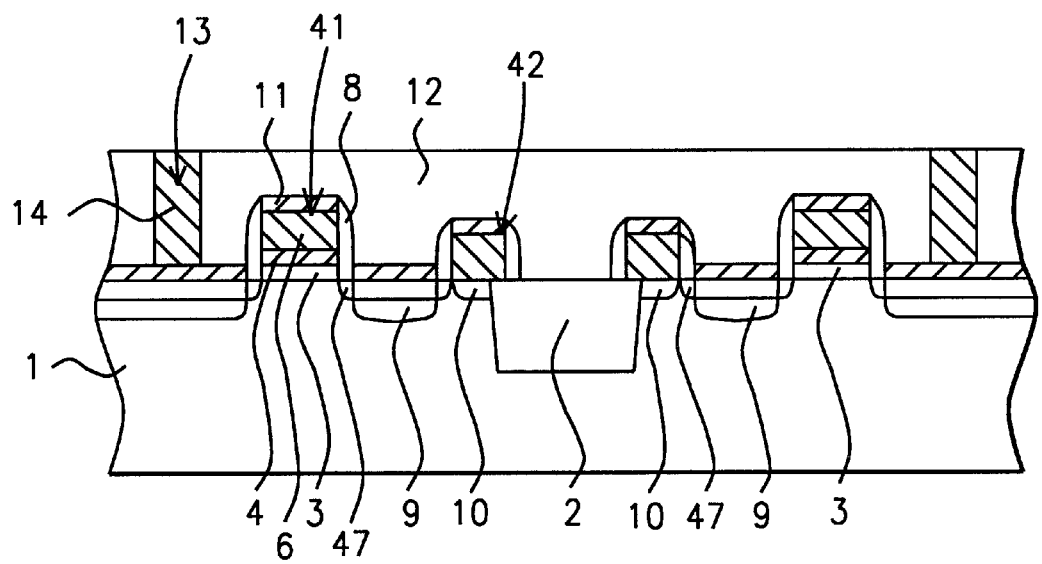

An interlevel dielectric layer, (ILD), 12, is next deposited, comprised of an underlying layer of undoped silicon oxide obtained via PECVD procedures, using tetraethylorthosilicate (TEOS) as a source, at a thickness between about 1000 to 2000 Angstroms, and comprised of an overlying layer of borophosphosilicate glass, obtained via PECVD procedures using TEOS, diborane, and phosphine, as reactants. A reflow anneal is next performed at a temperature between about 750 to 900° C., in a nitrogen ambient, resulting in a reflowed, smooth top surface topography for ILD layer 12. This is schematically shown in FIG. 8. Conventional photolithographic and anisotropic RIE procedures are used to form contact hole openings 13, in ILD layer 12, exposing a portion of the top surface of titanium silicide layer 11, in regions in which titanium silicide layer 11, overlays N type heavily doped source/drain regions 9, overlays the top surface of titanium silicide layer 11, and overlays P type heavily doped source/drain regions. (This is not shown in FIG. 8). Also not shown in the drawings is contact hole openings made to buried contact structures 42, in both NMOS and PMOS regions, and contact hole openings made to a dual gate polyscide structure, comprised of a region of N type polysilicon, in the NMOS region, and a region of P type polysilicon traversing the PMOS regions, of the SRAM cell. After removal of the photoresist shape used to define contact hole openings 13, via plasma oxygen ashing and careful wet cleans, a tungsten layer is deposited via LPCVD or via plasma vapor deposition procedures, completely filling contact hole openings 13. A CMP procedure is then employed to remove regions of the tungsten layer from the top surface of ILD layer 12, resulting in tungsten plug structures 14, in all contact hole openings 13. This is schematically shown in FIG. 8.

Figure 9A:
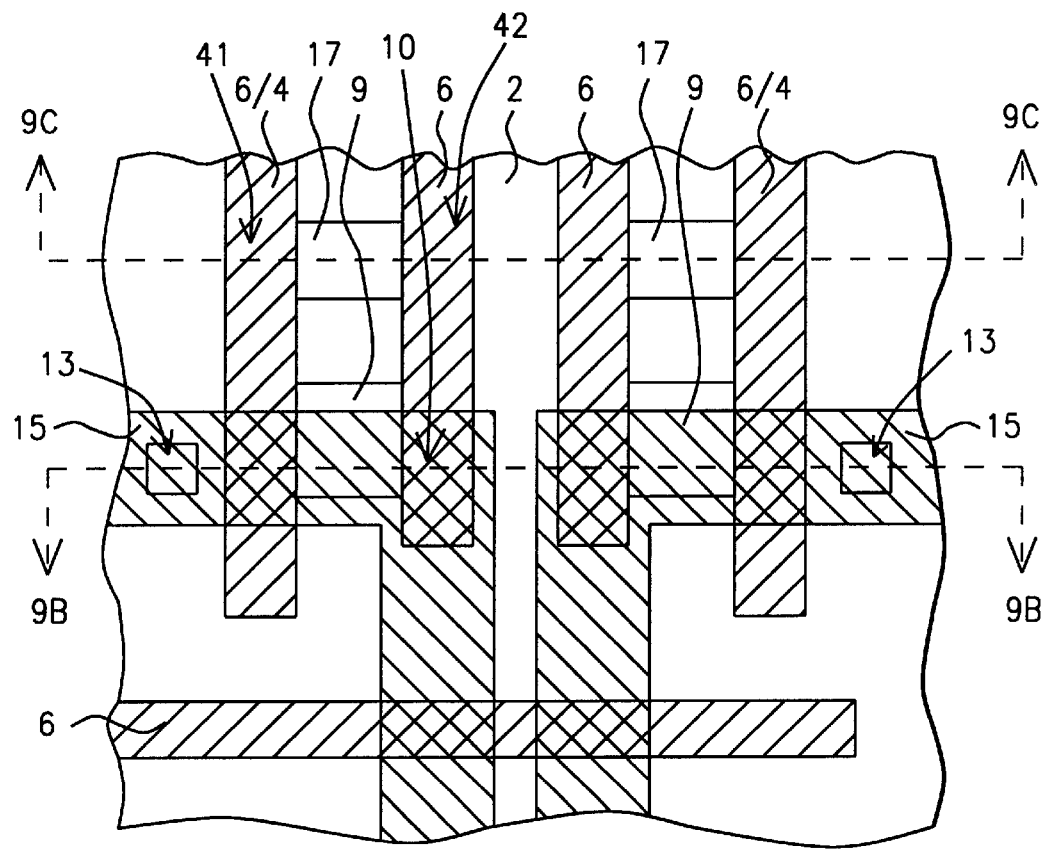
Figure 9B:
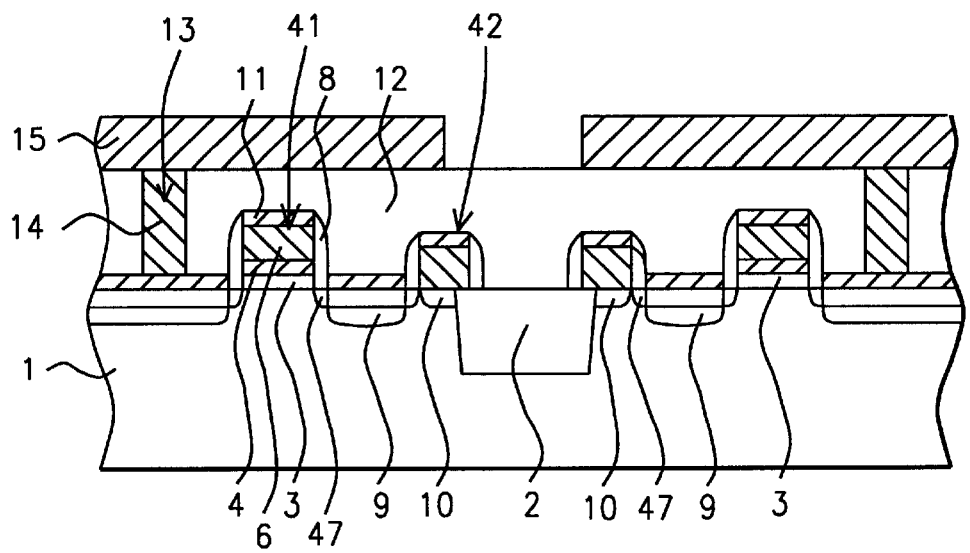
Figure 9C:
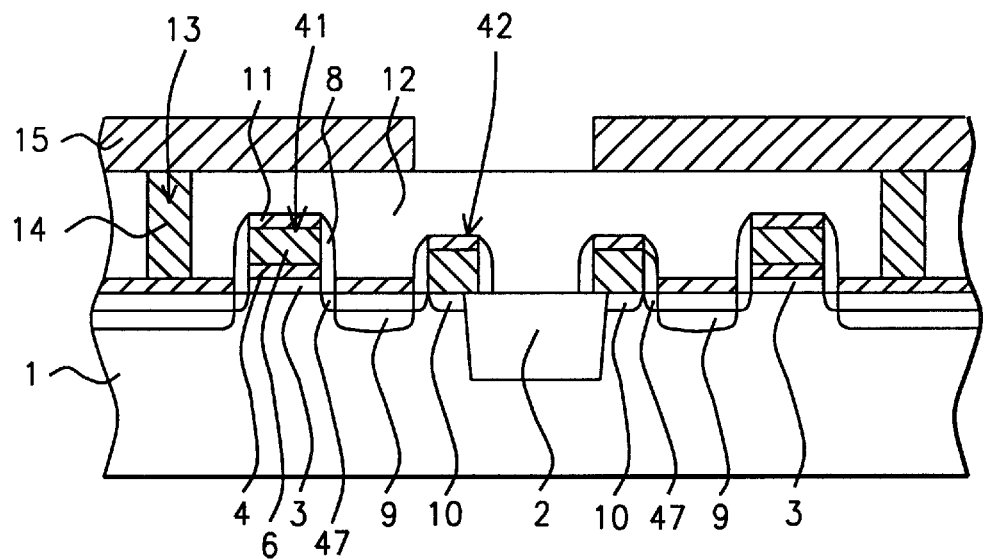

FIGS. 9A, 9B, and 9C, schematically describe the metallization used to wire or connect regions of the SRAM cell. A metal layer, such as aluminum-copper, copper, or tungsten, is deposited via plasma vapor deposition, or LPCVD procedures, to a thickness between about 1000 to 6000 Angstroms. Conventional photolithographic and RIE procedures, using $Cl_2$ as an etchant, are used to define metal interconnect structure 15, overlying and contacting tungsten plug structure 14, in the NMOS region of the SRAM cell. This is schematically shown in cross-sectional style in FIG. 9B. A top view of the SRAM cell, schematically shown in FIG. 9A, shows the connection of NMOS drain regions 9, to buried contact regions 10, located underlying buried contact structures 42, which in turn communicate with other N type drain regions located in semiconductor substrate 1, adjacent to polysilicon gate structures 41. FIG. 9C, schematically, in cross-sectional style, shows the PMOS region of the SRAM cell comprised with P type lightly doped source/drain regions 16, and P type, heavily doped source/drain regions 17. FIG. 9A, schematically shows PMOS drain regions 17, connected to a P type buried contact region, located underlying buried contact structure 42, in the PMOS region of the SRAM cell. Polysilicon gate structure, shown as 64, in FIG. 9A, is a dual polycide gate structure comprised of an N type portion traversing the NMOS region of the SRAM cell, and comprised of a P type portion traversing the PMOS region of the SRAM cell. The photoresist shape used to define metal interconnect structures 15, is removed via plasma oxygen ashing and careful wet cleans.

Figure 10:
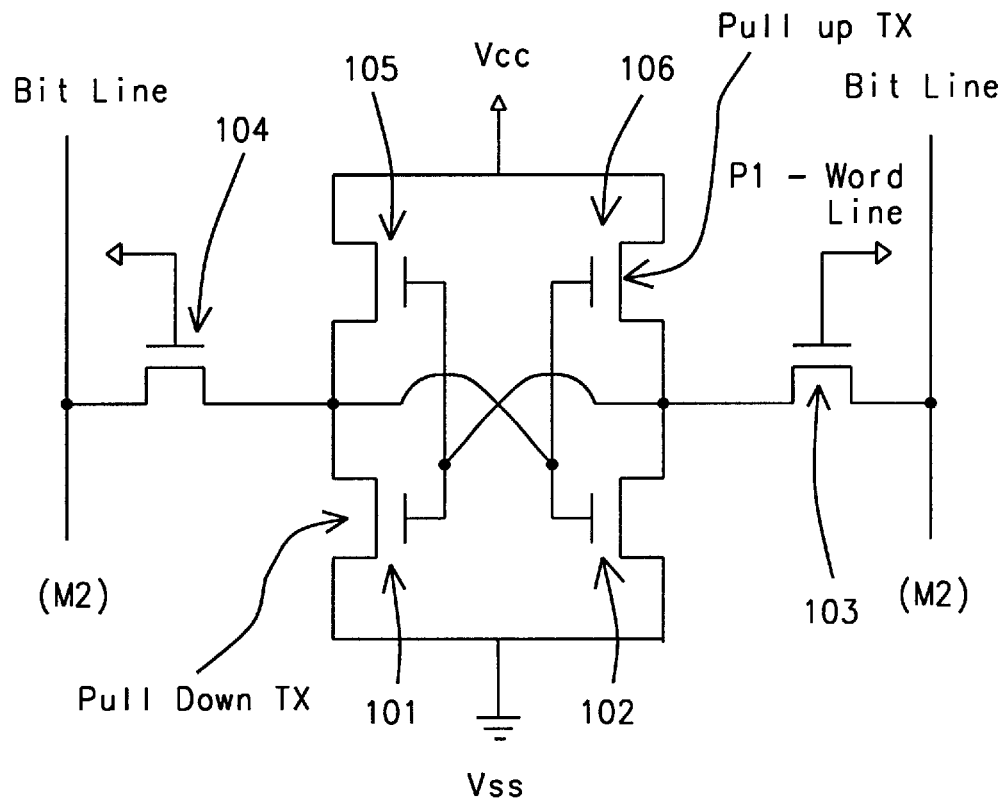
FIG. 10, which shows the circuit layout for the SRAM cell, fabricated using buried contact regions used to connect drain regions of NMOS devices, and drain regions of PMOS devices.

FIG. 10, schematically shows the electrical layout of the SRAM cell. The four NMOS devices, 101, 102, 103, and 104, are shown with the drain regions of NMOS device 101, or the pull down transistor, connected to NMOS device 102, via the buried contact regions. PMOS devices, 105, and 106, are shown with the drain region of pull up transistor 106, connected to PMOS transistor 105, again via the buried contact region. Also shown in the electrical schematic of FIG. 10, is NMOS transistor 103, and NMOS transistor 104, connected to metal bit line structures via polysilicon word line structures.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a static random access memory, (SRAM), cell on a semiconductor substrate, comprising the steps of:

forming gate structures on an underlying gate insulator layer;

forming buried contact structures on first portions of said semiconductor substrate;

forming N type lightly doped source/drain regions in second portions of said semiconductor substrate in a region to be used for NMOS devices of said SRAM cell;

forming P type lightly doped source/drain regions in third portions of said semiconductor substrate in a region to be used for PMOS devices of said SRAM cell;

forming insulator spacers on the sides of said gate structures and on the sides of said buried contact structures;

performing a first heavily doped ion implantation procedure; to form N type heavily doped source/drain regions in said second portions of said semiconductor substrate; to form N type buried contact structures, in regions in which said buried contact structures reside in said NMOS region of said SRAM cell; and to form N type polysilicon gate structures in an area in which said gate structures resides in said NMOS region of said SRAM cell;

performing a second heavily doped ion implantation procedure; to form P type heavily doped source/drain regions in said third portions of said semiconductor substrate; to form P type buried contact structures in regions in which said buried contact structures reside in said PMOS regions of said SRAM cell; and to form P type polysilicon gate structures in an area in which said gate structures reside in said PMOS region of said SRAM cell;

performing an anneal procedure to create N type buried contact regions underlying said N type buried contact structures and to create P type buried contact structures underlying said P type buried contact structures;

forming a metal silicide layer; on dual gate structures, comprised of said N type polysilicon gate structures and of said P type polysilicon gate structures; on said N type buried contact structures and on said P type buried contact structures; on said N type heavily doped source/drain regions and on said P type heavily doped source/drain regions;

forming contact hole openings in an interlevel dielectric layer exposing portions of said metal silicide layer with said contact hole openings; overlying a portion of said N type heavily doped source/drain regions; overlying a portion of said P type heavily doped source/drain regions; overlying portions of said dual gate structure; and overlying portions of said N type buried contact structure and said P type, buried contact structure;

forming metal plug structures in said contact hole openings; and forming metal interconnect structures overlying and contacting metal plug structures.

2. The method of claim 1, wherein said gate insulator layer is a silicon dioxide layer, obtained via thermal oxidation procedures, at a thickness between about 40 to 150 Angstroms.

3. The method of claim 1, wherein said gate structures are formed from an underlying layer of undoped, polysilicon, obtained via LPCVD procedures, at a thickness between about 250 to 750 Angstrom, and comprised of an overlying layer of undoped polysilicon, obtained via LPCVD procedures, at a thickness between about 500 to 1500 Angstroms.

4. The method of claim 1, wherein said buried contact structure is formed from a layer of undoped polysilicon, obtained from LPCVD procedures, at a thickness between about 500 to 1500 Angstroms.

5. The method of claim 1, wherein said insulator spacers, on the sides of said gate structures, and on the sides of said buried contact structures, are comprised of silicon oxide, or silicon nitride, at a thickness between about 600 to 2500 Angstroms.

6. The method of claim 1, wherein said N type, heavily doped source/drain regions are formed via said first heavily doped ion implantation procedure, using arsenic ions, at an energy between about 10 to 60 KeV, at a dose between about 2E15 to 6E15 atoms/cm$^2$.

7. The method of claim 1, wherein said N type, buried contact structures are formed via said first heavily doped ion implantation procedure, into buried contact structures that are located in said NMOS region of said SRAM cell, using arsenic ions at an energy between about 10 to 60 KeV, at a dose between about 2E15 to 6E15 atoms/cm$^2$.

8. The method of claim 1, wherein said N type, polysilicon gate structures are formed via said first heavily doped ion implantation procedure, into gate structures that reside in said NMOS region of SRAM cell, using arsenic ions, at an energy between about 10 to 60 KeV, and at a dose between about 2E15 to 6E15 atoms/cm$^2$.

9. The method of claim 1, wherein said P type, heavily doped source/drain regions, are formed via said second heavily doped ion implantation procedure, using boron or $BF_2$ ions, at an energy between about 2 to 60 KeV, and at a dose between about 2E15 to 6E15 atoms/cm$^2$.

10. The method of claim 1, wherein said P type, buried contact structures are formed via said second heavily doped ion implantation procedure, into buried contact structures residing in said PMOS region of said SRAM cell, using boron of $BF_2$ ions, at an energy between about 2 to 60 KeV, and at a dose between about 2E15 to 6E15 atoms/cm$^2$.

11. The method of claim 1, wherein said P type, polysilicon gate structures are formed via said second heavily doped ion implantation procedure, into gate structures that reside in said PMOS region of said SRAM cell, using boron or $BF_2$ ions, at an energy between about 2 to 60 KeV, and at a dose between about2E15 to 6E15 atoms/cm$^2$.

12. The method of claim 1, wherein said anneal procedure is performed using conventional furnace procedures, at a temperature between about 750 to 850° C., for a time between about 10 to 120 min, or said anneal procedure is performed using rapid thermal anneal procedures, at a temperature between about 850 to 1050° C., for a time between about 10 to 120 sec.

13. The method of claim 1, wherein said metal silicide layer is a titanium silicide, or a cobalt silicide layer, formed via deposition of a titanium, or cobalt layer, at a thickness between about 50 to 400 Angstroms, followed by a first RTA procedure, performed at a temperature between about 500 to 700° C., selective removal of unreacted titanium or cobalt, and a second RTA procedure, performed at a temperature between about 750 to 900° C.

14. A method of fabricating a static random access memory, (SRAM), cell on a semiconductor substrate, comprised with four NMOS devices and two PMOS devices featuring dual gate polycide structures and featuring buried contact regions, used to connect NMOS device drain regions, and to connect PMOS device drain regions comprising the steps of:

forming a silicon dioxide gate insulator layer on said semiconductor substrate;

depositing an undoped first polysilicon layer;

removing said first polysilicon layer and said silicon dioxide gate insulator layer from first regions of said semiconductor substrate to be used for drain regions and for said buried contact regions, for said NMOS devices and for said PMOS devices;

depositing a second polysilicon layer; patterning of said second polysilicon layer and of said first polysilicon layer to form gate structures on said silicon dioxide gate insulator and patterning said second polysilicon layer to form buried contact structures on first portions of said first regions of said semiconductor substrate;

forming N type lightly doped source/drain regions in second portions of NMOS first regions of said semiconductor substrate;

forming P type lightly doped source/drain regions in second portions of PMOS first regions of said semiconductor substrate;

forming insulator spacers on the sides of said gate structures and on the sides of said buried contact structures;

performing an N type ion implantation procedure; to form N type heavily doped source/drain regions, in said second portions of said NMOS first regions, of said semiconductor substrate; to form N type polysilicon gate structures in regions in which said gate structures reside in said NMOS device region; and to form N type buried contact structures in regions in which said buried contact structures reside in said NMOS device region;

performing a P type ion implantation procedure; to form P type heavily source/drain regions in said second portion of said PMOS first regions of said semiconductor substrate; to form P type polysilicon gate structures in regions in which said gate structures reside in said PMOS device region; and to form P type buried contact structures in regions in which said buried contact structures reside in said PMOS device region;

performing an anneal procedure to form N type buried contact regions in said first portions of said NMOS first regions of said semiconductor substrate underlying said N type buried contact structures, and forming P type buried contact regions, in said first portions of said PMOS first regions of said semiconductor substrate underlying said P type buried contact structures;

depositing a titanium layer;

performing a first rapid thermal anneal, (RTA) procedure to form a first titanium suicide layer; on the said N type heavily doped source/drain regions; on said P type heavily doped source/drain regions; on said dual gate polycide structures comprised of said N type polysilicon gate structures and said P type polysilicon gate structures; on said N type buried contact structures; and on said P type buried contact structures;

selectively removing unreacted regions of said titanium layer;

performing a second RTA procedure to convert said first titanium silicide layer to a second titanium silicide layer;

depositing an interlevel dielectric, (ILD), layer;

forming contact hole openings in said ILD layer to expose regions of said titanium silicide layer overlying portions of said N type heavily doped source/drain regions; said P type heavily doped source/drain regions; said N type buried contact structures; said P type buried contact regions; and said dual gate polycide structures;

forming tungsten plug structures in said contact hole openings; and forming metal interconnect structures overlying and contacting said tungsten plug structures.

15. The method of claim 14, wherein said silicon dioxide gate insulator layer, is obtained via thermal oxidation procedures, to a thickness between about 40 to 150 Angstroms.

16. The method of claim 14, wherein said first polysilicon layer is obtained via LPCVD procedures, to a thickness between about 250 to 750 Angstroms.

17. The method of claim 14, wherein said second polysilicon layer is obtained via LPCVD procedures, to a thickness between about 500 to 1500 Angstroms.

18. The method of claim 14, wherein said gate structures, and said buried contact structures, are formed via an anisotropic RIE procedure, using $Cl_2$ or $SF_6$ as an etchant, with the anisotropic RIE procedure performed to said second polysilicon layer, and to said first polysilicon layer, for said gate structures, and performed to said second polysilicon layer, for said buried contact structures.

19. The method of claim 14, wherein said N type ion implantation procedure, used to create said N type, heavily doped source/drain regions, said N type, polysilicon gate structures, and said N type, buried contact structures, is performed using arsenic ions, at an energy between about 10 to 60 KeV, at a dose between about 2E15 to 6E15 atoms/$cm^2$.

20. The method of claim 14, wherein said P type ion implantation procedure, used to create said P type, heavily doped source/drain regions, said P type, polysilicon gate structures, and said P type, buried contact structures, is performed using boron or $BF_2$ ions, at an energy between about 2 to 60 KeV, and at a dose between about 2E15 to 6E15 atoms/$cm^2$.

21. The method of claim 14, wherein said anneal procedure, used to form said buried contact regions, is performed using conventional furnace procedures at a temperature between about 750 to 850° C., for a time between about 10 to 120 min, in a nitrogen ambient, or using rapid thermal anneal procedures, at a temperature between about 850 to 1050° C., for a time between about 10 to 120 sec.

22. The method of claim 14, wherein said first RTA anneal, used to form said first titanium silicide layer, is performed at a temperature between about 500 to 700° C., for a time between about 10 to 120 sec., in a nitrogen ambient.

23. The method of claim 14, wherein said second RTA procedure, used to form said second titanium silicide layer, is performed at a temperature between about 750 to 900° C., for a time between about 10 to 120 sec., in a nitrogen ambient.

24. A static random access memory, (SRAM), cell on a semiconductor substrate, comprising:

four N channel (NMOS) devices, and two P channel (PMOS) device;

dual gate polycide structures on a silicon dioxide gate insulator layer, comprised with N type doping in a first region of said SRAM cell, where said dual gate polycide structure traverses said NMOS devices and comprised with P type doping in said second region of said SRAM cell, where said dual gate structure traverses said PMOS devices;

N type buried contact regions in first portions of said semiconductor substrate located in said first region of said SRAM cell;

N type buried contact structures overlying said N type buried contact regions;

N type heavily doped source/drain regions located in second portions of said semiconductor substrate located in said first region of said SRAM cell with said N type heavily doped source/drain regions located between said N type buried contact structures and said dual gate polycide structures in the region in which said dual gate structures traverse said NMOS devices;

P type buried contact regions in first portions of said semiconductor substrate located in said second region of said SRAM cell;

P type buried contact structures overlying said P type buried contact regions;

P type heavily doped source/drain regions, located in second portions of said semiconductor substrate, located in said second region of said SRAM cell, with said P type heavily doped source/drain region located between said P type buried contact structures and said dual gate polycide gate structures in a region in which said dual gate polycide gate structures traverse said PMOS devices;

an insulator spacer on the sides of said dual gate polycide structures and on the sides of the buried contact structures;

a metal silicide layer on the top surface; of said N type heavily doped source/drain regions; of said P type heavily doped source/drain regions; of said dual gate polycide structures; and of said buried contact structures;

metal plug structures, overlying and contacting regions of said metal silicide layer, which overlay regions; of said N type heavily doped source/drain regions of said P type heavily doped source/drain regions; of said dual gate polycide structures; and of said buried contact structures; and metal interconnect structures interconnecting pull down NMOS devices to PMOS devices and interconnecting pull up PMOS devices, to NMOS devices.

25. The SRAM cell of claim 24, wherein said insulator spacer, on the sides of said dual gate polycide structures, and on the sides of said buried contact structures, are comprised of either silicon oxide, or silicon nitride, at a thickness between about 600 to 2500 Angstroms.

26. The SRAM cell of claim 24, wherein said metal silicide layer is either a titanium silicide layer, or a cobalt silicide layer.

27. The SRAM cell of claim 24, wherein said metal plug structures are comprised of tungsten.

28. The method of claim 24, wherein said metal interconnect structures are comprised of a metal chosen from a group that includes, aluminum-copper, copper, and tungsten.

* * * * *